(12) United States Patent
Wang et al.

(10) Patent No.: US 12,301,128 B2
(45) Date of Patent: May 13, 2025

(54) HALF-BRIDGE FOR AN ELECTRIC DRIVE OF AN ELECTRIC VEHICLE OR A HYBRID VEHICLE, POWER MODULE FOR AN INVERTER AND INVERTER

(71) Applicant: ZF Friedrichshafen AG, Friedrichshafen (DE)

(72) Inventors: Pengshuai Wang, Eriskirch (DE); Ivonne Trenz, Friedrichshafen (DE); Florian Pahn, Ravensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 266 days.

(21) Appl. No.: 17/830,133

(22) Filed: Jun. 1, 2022

(65) Prior Publication Data

US 2022/0393615 A1 Dec. 8, 2022

(30) Foreign Application Priority Data

Jun. 2, 2021 (DE) ...................... 10 2021 205 632.6

(51) Int. Cl.
*H02M 7/00* (2006.01)
*H05K 7/14* (2006.01)

(52) U.S. Cl.
CPC .......... *H02M 7/003* (2013.01); *H05K 7/1432* (2013.01)

(58) Field of Classification Search
CPC .................................................. H02M 7/003
See application file for complete search history.

(56) References Cited

U.S. PATENT DOCUMENTS 10,177,676 B2 * 1/2019 Tokuyama .............. H01L 23/48
2020/0118986 A1 4/2020 Hori et al.

FOREIGN PATENT DOCUMENTS

| DE | 101 21 970 A1 | 11/2002 |
| DE | 696 35 440 T2 | 8/2006 |
| DE | 10 2006 050 291 A1 | 5/2007 |
| DE | 10 2006 006 423 A1 | 8/2007 |

(Continued)

OTHER PUBLICATIONS

Office Action for German Application No. 10 2021 205 632.6 dated Feb. 2, 2022 (14 pages).

*Primary Examiner* — Peter M Novak
(74) *Attorney, Agent, or Firm* — Crowell & Moring LLP

(57) ABSTRACT

A half-bridge having power connections and signal connections shaped from a leadframe, the signal connections electrically connected to semiconductor switching elements so that they can be switched by the signal connections, and the power connections are electrically connected to the switching elements in so that they switch an electrical power transmission between the power connections. The switching elements are embedded in a modular layer system including a contact-connection plane and a metallization for contact-connecting the switching elements, the signal connections and the power connections are arranged on a first surface of the substrate. The modular layer system, the signal connections and the power connections are potted with a potting compound, and external sections of the power connections and/or signal connections shaped in the leadframe extend out of the potting compound from a second surface orthogonal to the first surface, the external sections having ends that are perpendicular to the first surface.

10 Claims, 2 Drawing Sheets

(56) References Cited

FOREIGN PATENT DOCUMENTS

| | | |
|---|---|---|
| DE | 10 2006 008 632 A1 | 8/2007 |
| DE | 10 2006 027 481 A1 | 12/2007 |
| DE | 10 2012 208 146 A1 | 12/2012 |
| DE | 10 2015 101 086 A1 | 4/2015 |
| DE | 10 2015 109 814 A1 | 12/2015 |
| DE | 10 2015 115 271 A1 | 3/2017 |
| DE | 10 2015 012 915 A1 | 4/2017 |
| EP | 0 772 235 A2 | 5/1997 |

* cited by examiner

HALF-BRIDGE FOR AN ELECTRIC DRIVE OF AN ELECTRIC VEHICLE OR A HYBRID VEHICLE, POWER MODULE FOR AN INVERTER AND INVERTER

CROSS-REFERENCE TO RELATED APPLICATIONS

This application claims priority from German Application No. DE 10 2021 205 632.6, filed on Jun. 2, 2021, the entirety of which is hereby fully incorporated by reference herein.

FIELD

The invention relates to a power module for an inverter of an electric drive of an electric vehicle or a hybrid vehicle and to a corresponding inverter.

BACKGROUND AND SUMMARY

The prior art discloses pure electric vehicles and hybrid vehicles that are driven exclusively or in a manner supported by one or more electric machines as drive assemblies. In order to supply electrical energy to the electric machines of such electric vehicles or hybrid vehicles, the electric vehicles and hybrid vehicles comprise electrical energy stores, in particular rechargeable electric batteries. In this case, these batteries are formed as DC voltage sources; however, the electric machines usually require an AC voltage. Therefore, a power electronics system comprising what is known as an inverter is usually connected between a battery and an electric machine of an electric vehicle or a hybrid vehicle.

Inverters of this kind usually comprise semiconductor switching elements, which are typically formed from transistors. In this case, it is known to provide the semiconductor switching elements in different degrees of integration, specifically either as discrete individual switches with a low degree of integration but high scalability, as power modules with a high degree of integration but low scalability, and as half-bridges that range between individual switches and half-bridges with respect to degree of integration and scalability. Each half-bridge comprises a high-side switching position (subsequently: high side) having a higher electrical potential and a low-side switching position (subsequently: low side) having a lower electrical potential. The high side and the low side may each comprise one or a plurality of individual switches that are connected in parallel.

DE 10 2006 050 291 A1 discloses an electronic assembly that comprises a semiconductor circuit breaker and a semiconductor diode. Here, a bottom side of the semiconductor circuit breaker comprises an output contact mounted on a chip field of a carrier strip. In addition, a top side of the semiconductor circuit breaker comprises a control contact and an input contact. An anode contact of the semiconductor diode is arranged on the input contact of the semiconductor circuit breaker and electrically connected thereto. A cathode contact of the diode is electrically connected to the output contact of the power semiconductor switch.

DE 10 2006 008 632 A1 discloses a power semiconductor component part that comprises a leadframe, at least one vertical power semiconductor component and at least one further electronic component part. The vertical power semiconductor component has a first side and a second side. At least one first contact face and at least one control contact face are arranged on the first side. At least one second contact face is arranged on the second side. The at least one further electronic component part is arranged on the second contact face of the vertical power semiconductor component.

DE 10 2015 012 915 A1 discloses a semiconductor module comprising at least two semiconductor elements, which each have at least one first electrode on a first side and at least one second electrode on a second side. The first semiconductor element is arranged above the second semiconductor element. An electrically conductive connection is arranged between the first semiconductor element and the second semiconductor element. The at least one second electrode of the first semiconductor element is connected mechanically and electrically to the electrically conductive connection. The at least one first electrode of the second semiconductor element is connected mechanically and electrically to the electrically conductive connection.

The as yet unpublished DE 10 2019 220 010.9—the disclosure of which is intended to be incorporated in the present patent application—discloses a power module, in which the signal connections and the power connections are all arranged on a common side of the substrate and are surrounded by a potting compound. The power connections and the signal connections are all accessible from the common side of the substrate in such a way that the power connections and the signal connections extend through the potting compound as seen from the common side of the substrate and are arranged within a base area spanned by the substrate as seen from the passage direction through the potting compound.

The as yet unpublished DE 10 2020 205 420.7—the disclosure of which is intended to be incorporated in the present patent application—discloses a power module, in which the power connections and the signal connections are all formed in a leadframe. Ends of the power connections and of the signal connections extend laterally from the potting compound and each exhibit a right-angled bend perpendicular to a face along which the leadframe extends.

Busbars are used for the purpose of contact-connecting the power connections from outside. A positive busbar is used to contact-connect the positive DC power connection and is connected thereto. A negative busbar is used to contact-connect the negative DC power connection and is connected thereto. An AC busbar is used to contact-connect the AC power connection and is connected thereto. As a result of the fact that high voltage differences prevail between the potentials, which are up to several hundred volts, applied to the respective power connections in high-voltage applications, the power connections and, as a consequence, also the associated busbars thereof must be electrically insulated from one another. To this end, the creepage paths and air gaps between the individual power connections and between the individual busbars must observe a minimum distance.

In order to meet this requirement, in the previously known half-bridges and inverters, the distance between the power connections or between the busbars is selected to be relatively large. If the distance is large enough, the air gaps and creepage paths demanded are observed and the requirements are met. A smaller distance between the busbars leads to a low-inductance busbar design in which the half-bridges or the inverter require a large installation space, which contradicts the aim in the current automotive industry of designing electronic components installed in a vehicle to be more and more compact.

It is an object of the invention to provide a half-bridge for an electric drive of an electric or hybrid vehicle in which the disadvantages mentioned above are at least partly overcome.

This object is achieved in accordance with the invention by way of the half-bridge, the power module and the inverter according to the present disclosure. Advantageous embodiments and refinements of the invention will emerge from the present disclosure.

The invention relates to a half-bridge for an electric drive of an electric vehicle or of a hybrid vehicle.

The substrate may be formed, for example, as a DBC (direct bonded copper) substrate, as a DPC (direct plated copper) substrate, as an AMB (active metal brazing) substrate or as an IM (insulated metal) substrate. The semiconductor switching elements, in particular transistors and diodes, are arranged on one side of the substrate and the associated power connections and signal connections are arranged on the other side. The substrate is preferably of rectangular form, in particular formed as a flat, disk-like rectangle, comprising in each case two opposite side edges. If necessary, the substrate can also be of square form.

The semiconductor switching elements form a high side and a low side in the half-bridge. The high side comprises one or more semiconductor switching elements connected in parallel with one another and enables the flow of current between the AC power connection and the positive DC power connection. The low side comprises one or more semiconductor switching elements connected in parallel with one another and enables the flow of current between the AC power connection and the negative DC power connection. The high side and the low side are connected in series with one another.

The power connections are for their part electrically connected to power contacts integrated into the semiconductor switching elements, for example source electrodes and drain electrodes, or to earth's mass, so that electrical power can be transmitted from one power connection through a semiconductor switching element to a further power connection. In this case, the electrical supply of the electric motor for driving the electric vehicle or the hybrid vehicle is ensured by means of the power connections.

The signal connections are used to electrically switch the semiconductor switching elements and are accordingly electrically connected to signal contacts of the semiconductor switching elements integrated into the semiconductor switching elements. Depending on the design of the semiconductor switching elements, the semiconductor switching element can be switched so as to conduct current or to block current by way of energization or applying a voltage to the signal contact. In this way, the semiconductor switching elements are preferably switched according to pulse-width modulation (PWM) in order to make a sinusoidal time profile of the phase currents possible.

The semiconductor switching elements, the power connections and the signal connections of the half-bridge according to the invention are preferably arranged on a first face of the substrate. The power connections and the signal connections can be contact-connected there in a simple manner by external components, in particular busbars. The first face is preferably one of the two comparatively largest faces of the layered substrate that are located opposite one another. The first face defines a main plane of the substrate.

The substrate is preferably potted using a potting compound by way of an injection-molding method. The power connections and/or the signal connections preferably have external sections that extend from a second face orthogonal to the first face out of the potting compound toward outside. The second face is in this case a "side face" of the potted layered substrate, which is generally much smaller than the first face. The external sections preferably each have an end that extends perpendicularly to the first face. This enables simple electrical contact-connection of the power connections or the signal connections from outside of the half-bridge.

A respective busbar is provided for the positive DC power connection and for the negative DC power connection for the purpose of external contact-connection, said busbar being connected to the respective power connection. The busbar of the positive DC power connection and of the negative DC power connection extends along a direction parallel to the main plane of the substrate between a printed circuit board and the substrate. The busbar has a top side, which faces toward the printed circuit board, and a bottom side, which faces toward the substrate.

According to the invention, the busbar of the positive DC power connection and/or of the negative DC power connection is at least partly covered by a current-isolating coating. The current-isolating coating may be a prefabricated component, for instance made of plastic, which comprises a recess for receiving the busbar(s). As an alternative, the current-isolating coating may be an injection-molded part, which is injected onto the positive DC power connection and/or the negative DC power connection by means of an injection-molding process.

As a result of the fact that the busbar at least of one of the two DC power connections is at least partly coated by the current-isolating coating, the creepage path between the busbars of the two DC power connections is extended. In this way, a reliable DC isolation between the busbars of the two DC power connections is ensured. At the same time, the distance between the two busbars of the DC power connections can be reduced, which leads to a low-inductance inverter.

The invention furthermore relates to a power module having at least three half-bridges according to the invention, wherein each of the half-bridges is preferably associated with one of at least three current phases of an alternating current, which is generated by means of the power module based on a direct current that is fed in. The invention furthermore relates to an inverter for an electric drive of an electric vehicle or a hybrid vehicle comprising a power module of this kind. This results in the advantages that have already been described in connection with the half-bridge according to the invention for the power module according to the invention and the inverter according to the invention as well.

According to one embodiment, the top side and/or the bottom side of the busbar is covered by the current-isolating coating. The top side of the busbar faces toward the printed circuit board. The bottom side of the busbar faces toward the substrate or the potting compound. A coating of the busbar with the current-isolating coating only on one side has the advantage of saving material. A coating of the busbar with the current-isolating coating on two sides has the advantage of further extending the creepage path between the busbars of the two DC power connections.

According to another embodiment, the busbar covered by the current-isolating coating has two surface sections, which enclose an angle with one another, along the direction parallel to the main plane of the substrate. The covered busbar has a first surface section along the direction running parallel to the main plane of the substrate. At the end of the first surface section, the first surface section transitions into a second surface section, which encloses the angle with the first surface section. The angle is preferably greater than 90 degrees and less than 180 degrees. The second surface section can be achieved by way of a rib formed in the current-isolating coating. This measure additionally extends the creepage path between the busbars of the two DC power connections.

According to another embodiment, only one of the two busbars is covered by the current-isolating coating, wherein the other of the two busbars is coated on a side facing away from the substrate by an insulating thin-layer film. The insulating thin-layer film may for example be led out of an intermediate circuit capacitor. The insulating thin-layer film is a flexible film, which can be adapted particularly easily to the shape of the busbar that is not covered, in particular overmolded, by the current-isolating coating. This ensures an improved DC isolation between the two busbars.

According to another embodiment, the top side of the printed circuit board is fixed to the current-isolating coating of the positive DC busbar and/or the current-isolating coating of the positive DC busbar is fixed to the bottom side of an inverter housing. Particularly stable fixing of the printed circuit board is achieved in this way. A secure connection between the busbar and the associated DC power connection is therefore ensured. A screw connection and/or a hot-swaged plastic dome may be provided for the fixing. A hot-swaged plastic dome is a plastic dome that extends out of the current-isolating coating through an opening in the printed circuit board and is melted by means of hot swaging and is cured after subsequent cooling and thus achieves fixing.

The invention will be discussed by way of example below on the basis of embodiments illustrated in the figures.

DETAILED DESCRIPTION

Identical objects, functional units and similar components are denoted by the same reference designations throughout the figures. These objects, functional units and similar components are of identical design in terms of their technical features unless explicitly or implicitly stated otherwise in the description.

Figure 1:
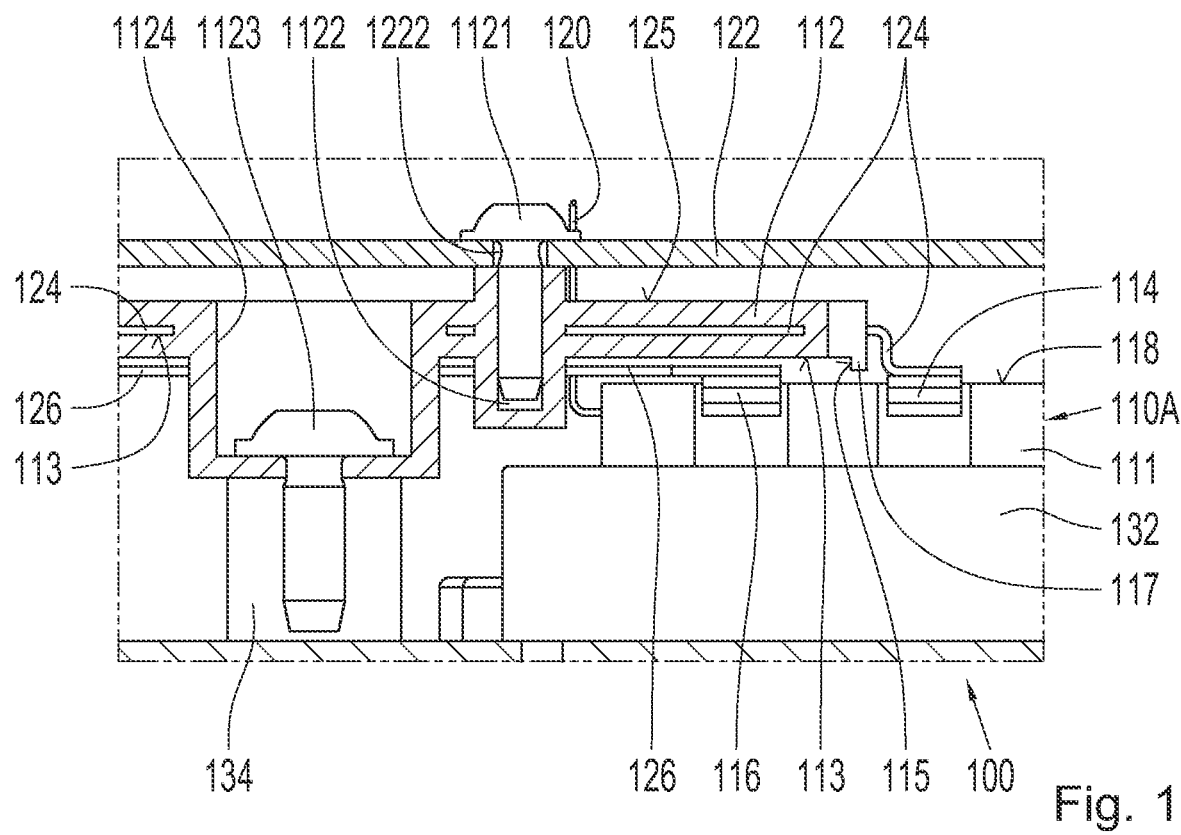
FIG. 1 shows a schematic lateral sectional view of an inverter comprising a half-bridge according to the invention in accordance with various embodiments.
Figure 2:
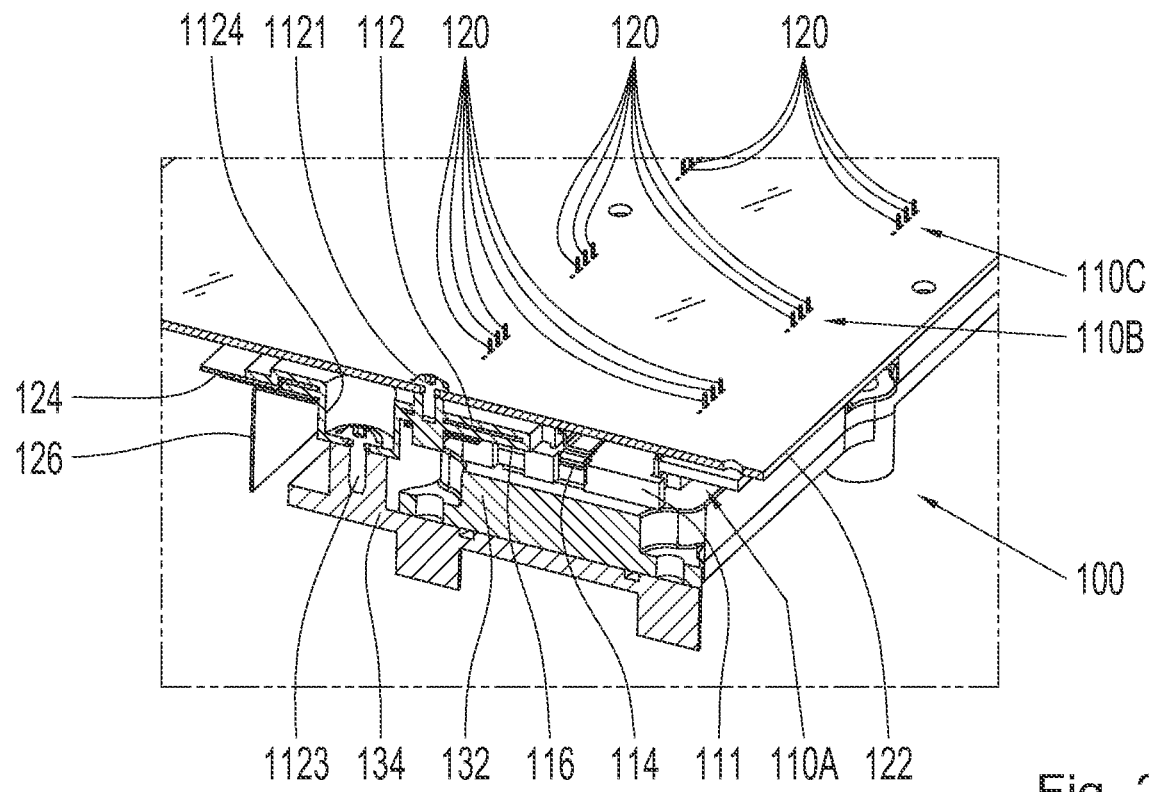
FIG. 2 shows a schematic perspective side view of the inverter from FIG. 1.

FIGS. 1 and 2 show a schematic illustration of an inverter 100 in accordance with an embodiment.

FIG. 1 schematically shows a lateral side view of the inverter 100. The inverter 100 comprises a plurality of half-bridges 110A, 110B, 110C, which are illustrated schematically in a perspective sectional view in FIG. 2. Each half-bridge 110A, 110B, 110C comprises a plurality of semiconductor switching elements, which are not shown here. The semiconductor switching elements form a high side and a low side, which each comprise one or more semiconductor switching elements connected in parallel. Each of the half-bridges 110A, 110B, 110C is associated with a current phase. Each half-bridge 110A, 110B, 110C comprises a substrate (not shown), on which the semiconductor switching elements are mounted. The substrate is preferably a direct bonded copper (DBC) substrate having a first and a second metal layer and also an insulating layer arranged in between. The semiconductor switching elements of the respective half-bridge 110A, 110B, 110C are arranged on the first metal layer. A heatsink 132 is connected to the second metal layer.

The semiconductor switching elements and the substrate are potted with a potting compound 111 (for example plastic) for protection from external environmental influences. The substrate defines a main plane parallel to the metal and insulating layers, which main plane runs perpendicular to the plane of the drawing in FIG. 1. A positive DC power connection 114 and a negative DC power connection 116 and a plurality of signal connections 120 emerge laterally from the potting compound 111 and can be contact-connected from above. The DC power connections 114, 116 are used to feed in an input current, which is a direct current and can be converted to a multiphase alternating current by means of actuation of the semiconductor switching elements. The signal connections 120 are used in combination with an actuation printed circuit board 122 to actuate the semiconductor switching elements, said actuation printed circuit board having conductor tracks and electronic components in order to generate control signals and transmit same via the signal connections to the gate electrodes of the semiconductor switching elements.

The positive DC power connection 114 is contact-connected externally by means of a positive DC busbar 124. At the same time, the negative DC power connection 116 is contact-connected externally by means of a negative DC busbar 126. Both the positive DC busbar 124 and the negative DC busbar 126 are plate-shaped and extend parallel to the main plane of the substrate between the printed circuit board 122 and potting compound 111. As shown in FIG. 1 and FIG. 2, the top side 125 and the bottom side 123 of the positive DC busbar 124 are covered by a current-isolating coating 112, which is preferably provided here as an overmold by means of an injection-molding process. The positive DC busbar 124 is preferably first overmolded by the current-isolating coating and only connected to the positive DC power connection 114 after the overmolding.

The coating or overmolding 112 has a rib 117, in this case for example at one end, said rib comprising a first surface section 113 and a second surface section 115, wherein both surface sections 113, 115 enclose an angle. The rib 117 is used to extend the air gaps and creepage paths. In this embodiment, the negative DC busbar 126 is not covered by a current-isolating coating but is mounted below the overmolded positive DC busbar 124. Material cutouts, for example as screw-attachment points of the overmolded positive DC busbar 124, are provided in the negative DC busbar 126.

A coating by means of a current-isolating coating or overmold 112 increases the creepage path between the two DC busbars 124, 126 and increases the safety of the inverter 100 with respect to DC isolation between the positive DC potential and the negative DC potential, which is important in high-voltage applications. In this way, a minimum of air gaps and creepage paths can be observed.

To fix the coating or overmold 112 on the top side of the printed circuit board 122, provision is made of a first screw connection, in which a screw 1121 is inserted through a hole 1222 in the printed circuit board 122 into an opening 1122 formed in the coating or overmold 112. As an alternative, a hot-swaged plastic dome can be used, as is described in more detail in FIG. 3. This permits a high mechanical stability of the overall construction of the coating or overmold 112, the potting compound 111 and the printed circuit board 122, and secures the connection between the power connections 114, 116 and the busbars 124, 126. In addition, the signal connections 120 pass through the coating or overmold 112 and further up also through the printed circuit board 122, as shown in more detail in FIG. 2. To fix the coating or overmold 112 on the bottom side of an inverter housing 134, provision is made of a second screw connection, in which a screw 1123 is inserted through a recess 1124 formed in the coating or overmold 112 into an opening arranged in the inverter housing 134.

The overmolded busbar consisting of the positive DC busbar 124 and the overmold 112 is screwed into the inverter housing 134 by means of the screw 1123 via the shaped dome or screw-connection 1124. The printed circuit board 122 is screwed into the formed screw dome 1122 of the plastic overmold 112 through the hole (or bore) 1222 by means of the screw 1121. The screw joint 1123 of the overmolded busbar into the rigid inverter housing 134 and the screw connection of the printed circuit board 122 into the overmolded busbar by means of the screw 1121 produces a structure with a high mechanical stability/rigidity.

The screw-connection points comprising the screws 1121 and 1123 are preferably arranged next one another. As a result, the printed circuit board 122 can be connected to the rigid inverter housing 134 as best as possible via the overmolded busbar. At the same time, the vibrational loads on the printed circuit board 122 can be reduced.

The screwing by means of the screw 1123 is additionally used to mechanically stabilize the overmolded busbar into the inverter housing 134 and to reduce the mechanical load, such as for example through vibration on the connection between the positive power connections 114 on the one hand and the positive DC busbar 124 on the other. The signal connections 120 are inserted and contact-connected to the printed circuit board 122 by way of the overmold 112.

Figure 3:
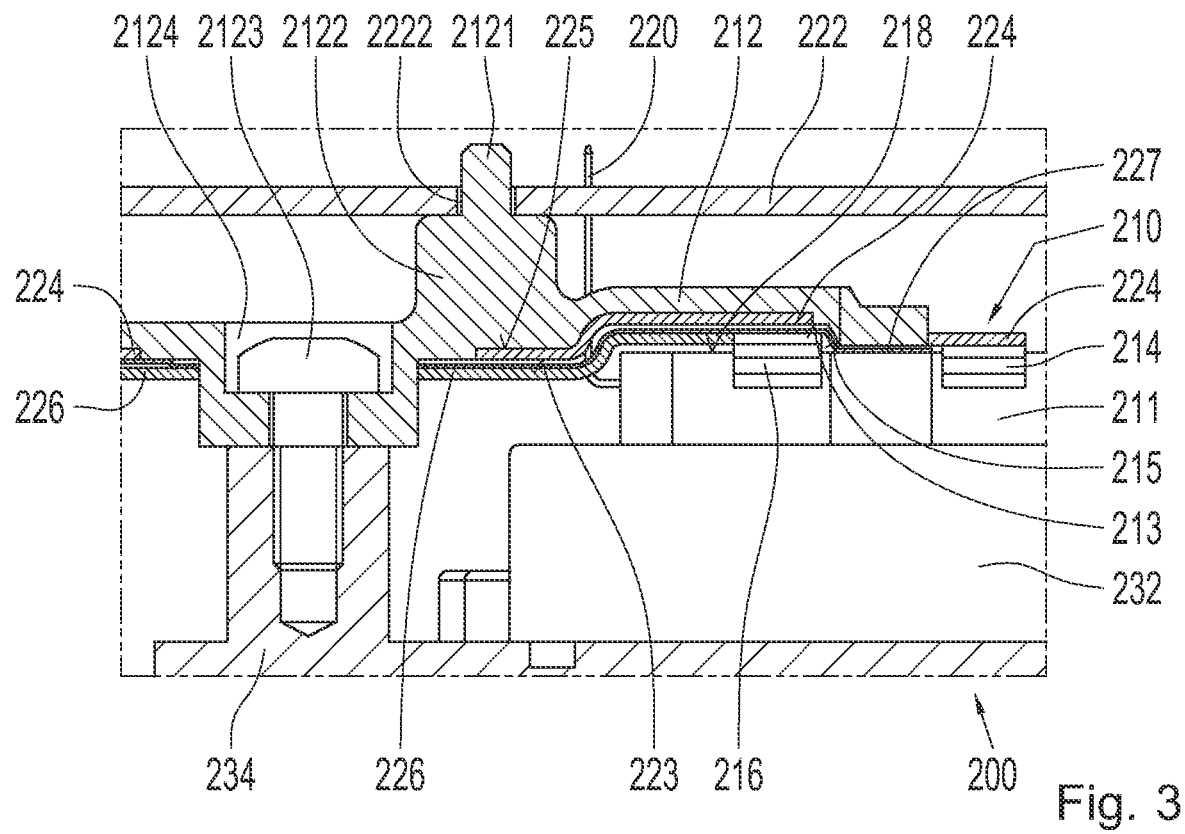
FIG. 3 shows a schematic lateral sectional view of an inverter comprising a half-bridge according to the invention in accordance with further embodiments.
Figure 4:
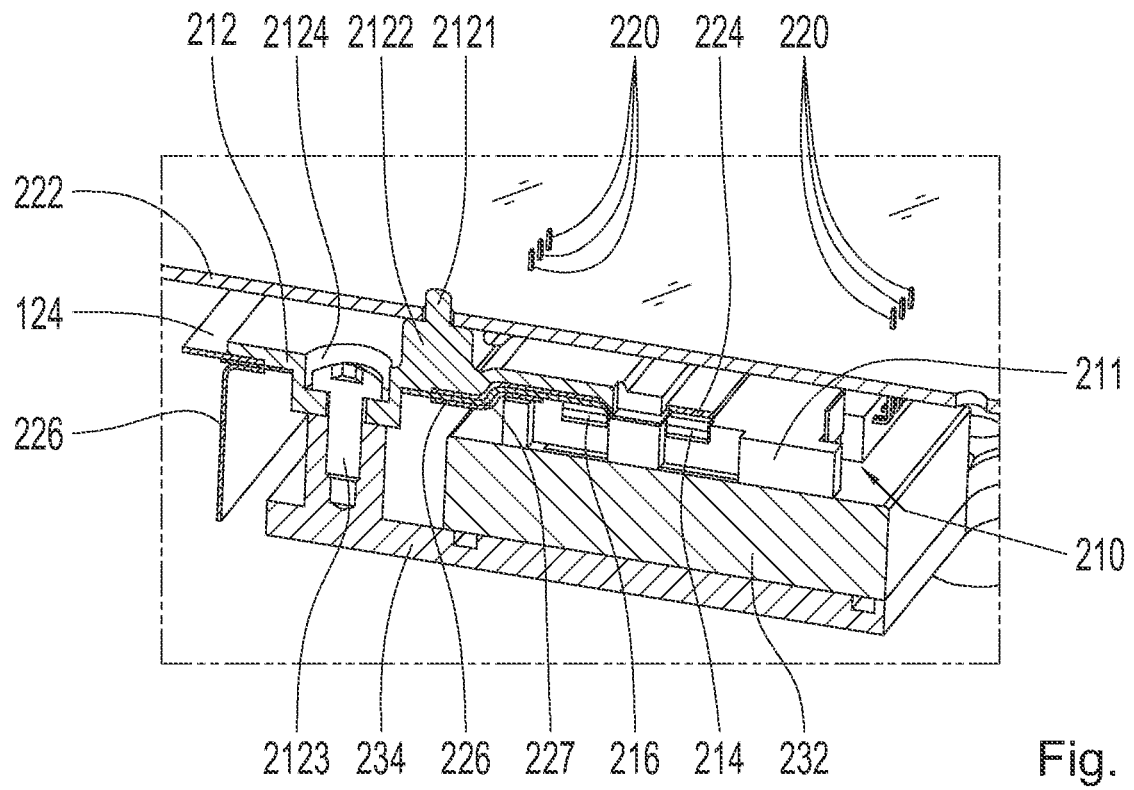
FIG. 4 shows a schematic perspective view of the inverter from FIG. 3.

FIGS. 3 and 4 show a schematic illustration of an inverter 200 in accordance with a further embodiment.

FIG. 3 schematically shows a lateral side view of the inverter 200. FIG. 4 shows a perspective side view of the inverter 200. The inverter 200 comprises a plurality of half-bridges 210, wherein in this case only one half-bridge 210 is shown. Each half-bridge 210 comprises a plurality of semiconductor switching elements, which are not shown here. The semiconductor switching elements form a high side and a low side, which each comprise one or more semiconductor switching elements connected in parallel. Each of the half-bridges 210 is assigned to a current phase. Each half-bridge 210 comprises a substrate (not shown), on which the semiconductor switching elements are mounted. The substrate is preferably a direct bonded copper (DBC) substrate having a first and a second metal layer and also an insulating layer arranged in between. The semiconductor switching elements of the respective half-bridge 210 are arranged on the first metal layer. A heatsink 232 is connected to the second metal layer.

Analogously to the inverter 100 from FIGS. 1-2, in this case the semiconductor switching elements and the substrate are also potted with a potting compound 211 (for example plastic) for protection from external environmental influences. The substrate defines a main plane parallel to the metal and insulating layers, which main plane runs perpendicular to the plane of the drawing in FIG. 3. A positive DC power connection 214 and a negative DC power connection 216 and a plurality of signal connections 220 emerge laterally from the potting compound 211 and can be contact-connected from above. The DC power connections 214, 216 are used to feed in an input current, which is a direct current and can be converted to a multiphase alternating current by means of actuation of the semiconductor switching elements. The signal connections 220 are used in combination with an actuation printed circuit board 222 to actuate the semiconductor switching elements, said actuation printed circuit board having conductor tracks and electronic components in order to generate control signals and transmit same via the signal connections to the gate electrodes of the semiconductor switching elements.

The positive DC power connection 214 is contact-connected externally by means of a positive DC busbar 224. At the same time, the negative DC power connection 216 is contact-connected externally by means of a negative DC busbar 226. Both the positive DC busbar 224 and the negative DC busbar 226 are plate-shaped and extend parallel to the main plane of the substrate between the printed circuit board 222 and the potting compound 211. As shown in FIG. 3 and FIG. 4, the top side 225 of the positive DC busbar 224 is covered by a current-isolating coating 212, which is here preferably provided as an overmold by means of an injection-molding process. The bottom side 223 of the positive DC busbar 224 is not coated, however. The positive DC busbar 224 is preferably first overmolded by the current-isolating coating and only connected to the positive DC power connection 214 after the overmolding.

The positive DC busbar 224 has a bend. Accordingly, the coating or overmold 212 has, at one end, an angle between a first surface section 213 and a second surface section 215. The positive DC busbar 224 is cut out only locally in the region of the angle. The negative DC busbar 226 is covered by a current-isolating thin-layer film 227 on its side facing the positive DC busbar 224 and extends through the coating or overmold 212 of the positive DC busbar 224. The current-isolating thin-layer film 227 is cut out locally in order, as shown here by way of example, to arrange a screw dome (see recess 2124) for the screw joint by means of a screw 2123.

A coating by means of a current-isolating coating or overmold 212 increases the creepage path between the two DC busbars 224, 226 and increases the safety of the inverter 200 with respect to DC isolation between the positive DC potential and the negative DC potential, which is important in high-voltage applications. The use of the current-isolating thin-layer film 227 ensures the potential isolation. The positive DC busbar 224 is coated or overmolded only on the top side so that there is no overmold between the two DC busbars 224 and 226. The overmold 212 is used to isolate the positive DC busbar 224 from the printed circuit board 222. The bottom side of the positive DC busbar 224 preferably has a copper surface. The isolation between the positive DC busbar 224 and the negative DC busbar 226 is effected by means of the current-isolating thin-layer film 227. In this way, a minimum of air gaps and creepage paths can be observed.

To fix the coating or overmold 112 to the top side of the printed circuit board 222, provision is made of a hot-swaged plastic dome 2121, as is shown in more detail in FIG. 3. The plastic dome 2121 emerges through a hole 2222 formed in the printed circuit board 222. The plastic dome 2121 is melted by means of a hot-swaging method so that the plastic material completely closes the hole 2222. A base body 2122 of the plastic dome 2121 supports the printed circuit board 222 from below. This permits a high mechanical stability of the overall construction of the coating or overmold 212, the potting compound 211 and the printed circuit board 222, and secures the connection between the power connections 214, 216 and the busbars 224, 226. In addition, the signal connections 120 pass through the coating or overmold 112 and further up also through the printed circuit board 122, as shown in more detail in FIG. 4. Analogously to the embodiment from FIGS. 1-2, to fix the coating or overmold 212 on the bottom side of an inverter housing 234, provision is made of a screw connection, in which a screw 2123 is inserted through a recess 2124 formed in the coating or overmold 212 into an opening arranged in the inverter housing 234.

The overmolded busbar consisting of the positive DC busbar 224 and the overmold 212 is screwed into the inverter housing 234 by means of the screw 2123 via the shaped dome (see recess 2124), which is used as screw-connection point. The printed circuit board 222 is fixed to the overmold 212 through the hole (bore) 2222 by means of the hot-swaged dome 2121. The screw joint 2123 of the overmolded busbar into the rigid inverter housing 234 and the fixing of the printed circuit board 222 on the overmolded positive DC busbar 224 by means of the hot-swaged plastic dome 2121 produces a structure with a high mechanical stability/rigidity.

The screw-connection point for the screw 2123 and the fixing location for the plastic dome 2121 are preferably arranged next to one another. As a result, the printed circuit board 222 can be connected to the rigid inverter housing 234 as best as possible via the overmolded positive DC busbar 224. At the same time, the vibrational loads on the printed circuit board 222 can be reduced.

The screwing by means of the screw 2123 is additionally used to mechanically stabilize the overmolded busbar into the inverter housing 234 and to reduce the mechanical load, such as for example through vibration on the connection between the positive power connections 214 on the one hand and the positive DC busbar 224 on the other. The signal connections 220 are inserted and contact-connected to the printed circuit board 222 by way of the overmold 212.

REFERENCE DESIGNATIONS

- 100, 200 Inverter
- 110A-C, 210 Half-bridge
- 111, 211 Potting compound
- 112, 212 Coating/overmold
- 1121 Screw
- 2121 Plastic dome
- 1122 Opening
- 2122 Base body
- 1123, 2123 Screw
- 1124, 2124 Recess
- 113, 213 First surface section
- 114, 214 Positive DC power connection
- 115, 215 Second surface section
- 116, 216 Negative DC power connection
- 117 Rib
- 118, 218 Top side
- 120, 220 Signal connections
- 122, 222 Printed circuit board
- 1222, 2222 Hole
- 123, 223 Bottom side
- 124, 224 Positive DC busbar
- 125, 225 Top side
- 126, 226 Negative DC busbar
- 227 Thin-layer film
- 132, 232 Heatsink
- 134, 234 Inverter housing

We claim:

1. A half-bridge for an electric drive of an electric vehicle or a hybrid vehicle, the half-bridge comprising:
   a substrate;
   semiconductor switching elements;
   power connections; and
   signal connections,
   wherein the power connections comprise a positive DC power connection, a negative DC power connection and an AC power connection,
   wherein the signal connections are electrically connected to the semiconductor switching elements so that the semiconductor switching elements can be switched by the signal connections,
   wherein the power connections are electrically connected to the semiconductor switching elements so that the semiconductor switching elements permit or interrupt an electrical power transmission between the power connections,
   wherein a respective busbar is provided for the positive DC power connection and for the negative DC power connection for external contact-connection, the busbars being connected to the respective power connection,
   wherein the busbar of the positive DC power connection and of the negative DC power connection extend along a direction parallel to a main plane of the substrate between a printed circuit board and the substrate, wherein the busbars have a top side and a bottom side,
   wherein the busbar of the positive DC power connection and/or of the negative DC power connection is at least partly covered by a current-isolating coating, and
   wherein the current-isolating coating is directly fixed to the printed circuit board.

2. The half-bridge according to claim 1, wherein the current-isolating coating is a prefabricated component comprising a recess for receiving the busbar of the positive DC power connection and/or of the negative DC power connection.

3. The half-bridge according to claim 1, wherein the current-isolating coating is an injection-molded part that is injected onto the busbar of the positive DC power connection and/or of the negative DC power connection by means of an injection-molding process.

4. The half-bridge according to claim 1, wherein the top side and/or the bottom side of the busbar is covered by the current-isolating coating.

5. The half-bridge according to claim 1, wherein the busbar covered by the current-isolating coating has two surface sections, which enclose an angle with one another, along the direction parallel to the main plane of the substrate.

6. The half-bridge according to claim 1, wherein only one of the busbars is covered by the current-isolating coating, wherein the other of the busbars is coated on a side facing away from the substrate by an insulating thin-layer film.

7. The half-bridge according to claim 1, wherein at least one of a screw connection or a hot-swaged plastic dome is provided for the direct fixing.

8. A power module for an inverter, comprising at least three of the half-bridges according to claim 1.

9. An inverter for an electric drive of an electric vehicle or a hybrid vehicle, comprising the power module according to claim 8.

10. A half-bridge for an electric drive of an electric vehicle or a hybrid vehicle, the half-bridge comprising:
a substrate;
semiconductor switching elements;
power connections; and
signal connections,
wherein the power connections comprise a positive DC power connection, a negative DC power connection and an AC power connection,
wherein the signal connections are electrically connected to the semiconductor switching elements so that the semiconductor switching elements can be switched by the signal connections,
wherein the power connections are electrically connected to the semiconductor switching elements so that the semiconductor switching elements permit or interrupt an electrical power transmission between the power connections,
wherein a respective busbar is provided for the positive DC power connection and for the negative DC power connection for external contact-connection, the busbars being connected to the respective power connection,
wherein the busbar of the positive DC power connection and of the negative DC power connection extend along a direction parallel to a main plane of the substrate between a printed circuit board and the substrate, wherein the busbars have a top side and a bottom side,
wherein the busbar of the positive DC power connection and/or of the negative DC power connection is at least partly covered by a current-isolating coating, and
wherein the current-isolating coating extends to form a rib in an air gap located between at least two of the positive DC power connection, the negative DC power connection, the AC power connection, the busbar of the positive DC power connection, the busbar of the negative DC power connection, and the busbar of the AC power connection.

* * * * *